United States Patent
Bchir et al.

(10) Patent No.: US 8,703,602 B2
(45) Date of Patent: Apr. 22, 2014

(54) SELECTIVE SEED LAYER TREATMENT FOR FEATURE PLATING

(75) Inventors: Omar J. Bchir, San Diego, CA (US); Milind P. Shah, San Diego, CA (US); Sashidhar Movva, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 467 days.

(21) Appl. No.: 12/958,638

(22) Filed: Dec. 2, 2010

(65) Prior Publication Data

US 2012/0139112 A1     Jun. 7, 2012

(51) Int. Cl.
*H01L 21/4763*     (2006.01)
*H01L 29/40*     (2006.01)

(52) U.S. Cl.
USPC ............... 438/629; 438/675; 257/774

(58) Field of Classification Search
USPC .................. 438/629, 675; 257/774
See application file for complete search history.

(56) References Cited

U.S. PATENT DOCUMENTS

| | | | |
|---|---|---|---|
| 4,701,351 A * | 10/1987 | Jackson | 430/315 |
| 5,436,504 A * | 7/1995 | Chakravorty et al. | 257/758 |
| 6,035,527 A | 3/2000 | Tamm | |
| 6,867,473 B2 * | 3/2005 | Goodner et al. | 257/516 |
| 7,262,505 B2 | 8/2007 | Ahn et al. | |
| 2003/0180448 A1 | 9/2003 | Brook-Levinson et al. | |
| 2005/0153078 A1 | 7/2005 | Bentley et al. | |
| 2006/0038296 A1 * | 2/2006 | King et al. | 257/758 |
| 2008/0119016 A1 * | 5/2008 | Dubin et al. | 438/149 |
| 2008/0182409 A1 * | 7/2008 | Seidel et al. | 438/678 |
| 2009/0014882 A1 * | 1/2009 | Ito et al. | 257/758 |
| 2010/0129532 A1 | 5/2010 | Bai et al. | |

FOREIGN PATENT DOCUMENTS

| | | |
|---|---|---|
| JP | H08222834 A | 8/1996 |
| JP | 2002185184 A | 6/2002 |
| JP | 2004342824 A | 12/2004 |
| JP | 2005050969 A | 2/2005 |

OTHER PUBLICATIONS

Kevin Cheng, et al., "Ink-Jet Printing, Self-Assembled Polyelectrolytes, and Electroless Plating: Low Cost Fabrication of Circuits on a Flexible Substrate at Room Temperature", Macromolecular Rapid Communications, Feb. 7, 2005, pp. 247-264, vol. 26 Issue 4.
International Search Report and Written Opinion—PCT/US2011/063163—ISA/EPO—Mar. 20, 2012.

* cited by examiner

*Primary Examiner* — James Mitchell
(74) *Attorney, Agent, or Firm* — Michelle S. Gallardo

(57) ABSTRACT

Conventional metallization processes fail at high density or small feature size patterns. For example, during patterning dry films may collapse or lift-off resulting in short circuits or open circuits in the metallization pattern. An exemplary method for metallization of integrated circuits includes forming features such as trenches, pads, and planes in a dielectric layer and depositing and selectively treating a seed layer in desired features of the dielectric layer. The treated regions of the seed layer may be used as a seed for electroless deposition of conductive material, such as copper, into the features. When the seed layer is a catalytic ink, the seed layer may be treated by curing the catalytic ink with a laser.

11 Claims, 8 Drawing Sheets

SELECTIVE SEED LAYER TREATMENT FOR FEATURE PLATING

TECHNICAL FIELD

The present disclosure generally relates to integrated circuits (ICs). More specifically, the present disclosure relates to metallization of integrated circuits.

BACKGROUND

Metallization patterns in integrated circuits couple different components of the integrated circuit. As integrated circuits are increasing in complexity and density, the metallization patterns also increase in density to interconnect components of the integrated circuit. For example, features sizes of metallization patterns are shrinking in size below ten micrometers. As the features sizes continue to shrink, conventional metallization processes may fail resulting in open circuits and short circuits in the integrated circuit.

FIG. 1 is a flow chart illustrating a conventional method for metallization in integrated circuit substrates. The flow chart of FIG. 1 will be presented along with FIGS. 2A-2D, which are cross-sectional views illustrating a conventional integrated circuit. Referring to FIG. 2A, at block 102 a primer-coated copper foil (not shown) on a core substrate 202 is etched to remove the copper foil. At block 104 a copper seed layer 206 is electroless plated on a primer layer 204 remaining from the etched primer-coated copper foil. At block 106 a dry film 208 is deposited on the seed layer 206.

Referring to FIG. 2B, at block 108 the dry film 208 is patterned to form openings 210. At block 110 a conductive film 212 is electrodeposited into the openings 210 on the seed layer 206. Referring to FIG. 2C, at block 112 the dry film 208 is removed. Referring to FIG. 2D, at block 114 the seed layer 206 is etched between the conductive film features 212 to electrically isolate the features.

As the density of metallization lines increases the size of the conductive film features 212 shrinks. Additionally, the size of the dry film features between the conductive film features 212 standing after patterning the dry film, as shown in FIG. 2B, shrinks. As the aspect ratio of the standing dry film features increases, the stability of the dry film patterns decreases. For example, the dry film patterns may fail resulting in an open circuit or short circuit of the metallization pattern.

FIG. 3A is a cross-sectional view illustrating a conventional metallization failure resulting in an open circuit. When the aspect ratio of a pillar 308 of dry film is too large, the pillar 308 may collapse. Collapse of the pillar 308 prevents electrodeposition of conductive material into an opening on at least one side of the collapsed pillar 308. Thus, an open circuit in the metallization pattern may result from the collapsed pillar 308.

FIG. 3B is a cross-sectional view illustrating a conventional metallization failure resulting in a short circuit. When the width of the standing dry film features decreases, poor adhesion, undercut, or other process failure may result in lift-off of a standing dry film feature. For example, the pillar 310 may be lifted-off during patterning of the dry film 208. The lifted-off pillar 310 prevents separation of metallization lines on surrounding sides of the lifted-off pillar 310. Thus, a short circuit in the metallization pattern may result from the lifted-off pillar 310.

One alternative solution is to use a pattern trenched buildup process. During the buildup process, openings are patterned in a dielectric layer into which a seed layer is deposited. The seed layer is used for electrodepositing and overplating a conductive film. The overplated conductive material is removed through a planarization process. However, planarization reduces throughput of the metallization process and can increase infrastructure expense. Additionally, planarization may damage the surface of the dielectric layer.

Thus, there is a need for a method of metallization in integrated circuits supporting smaller feature sizes.

BRIEF SUMMARY

One embodiment discloses a method comprising a plurality of features formed in a dielectric material. A seed layer is deposited on the dielectric material and within the features. Portions of the seed layer are selectively treated within the features and untreated seed layer portions are removed. The treated seed layer portions are plated to selectively fill the features.

Another embodiment discloses an apparatus having a dielectric layer having a plurality of openings. A seed layer is on a bottom surface of the openings and a conductive material substantially fills the openings.

Optionally, an alternate embodiment discloses a method having the steps of forming a plurality of features in a dielectric material and depositing a seed layer on the dielectric material and within the features. Next, portions of the seed layer within the features are selectively treated. Then, the untreated seed layer portions are removed. The treated seed layer portions are plated to selectively fill the features.

In another embodiment, an apparatus includes a dielectric layer on a substrate. The apparatus has a plurality of openings and a means for electroplating a conductive material. The electroplating means is disposed on a bottom surface of the openings. A conductive material on the electroplating means substantially fills the openings.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

A process for forming metallization patterns of an integrated circuit may reach higher densities and smaller sizes by removing a dry film patterning and lift-off (i.e., removal) process that may result in short circuits or open circuits in the metallization pattern. According to one embodiment, a seed layer is deposited and selectively treated to remain on a bottom surface of an opening in a dielectric for metallization. The treated seed layer may be used as a seed layer for electrodepositing a conductive material into the opening for metallization. When the conductive material is electrodeposited into the dielectric layer no lift-off processes are used, which reduces aspect ratio problems leading to short circuits and open circuits. Additionally, when the conductive material is electroless deposited, the conductive material is substantially planar with the dielectric layer and no overplating occurs.

Figure 1:
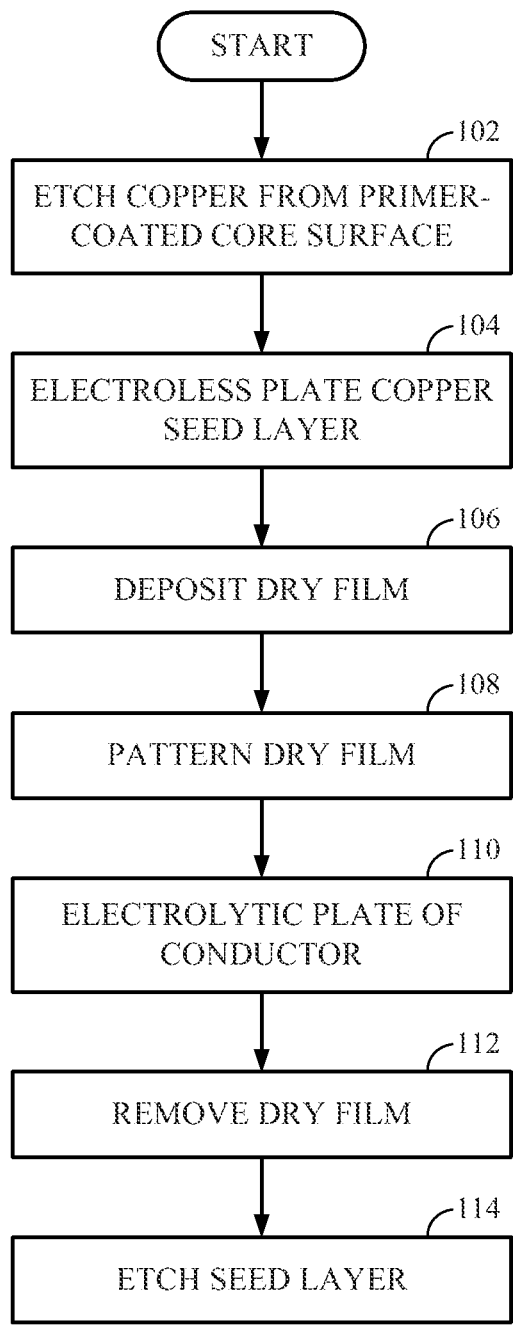
FIG. 1 is a flow chart illustrating a conventional method for metallization in integrated circuits.
Figure 2A:
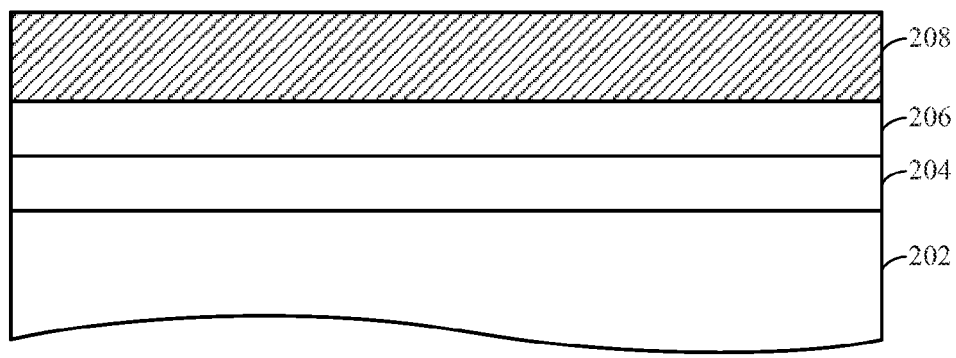
FIGS. 2A-D are cross-sectional views illustrating a conventional method for metallization in integrated circuits.
Figure 2B:
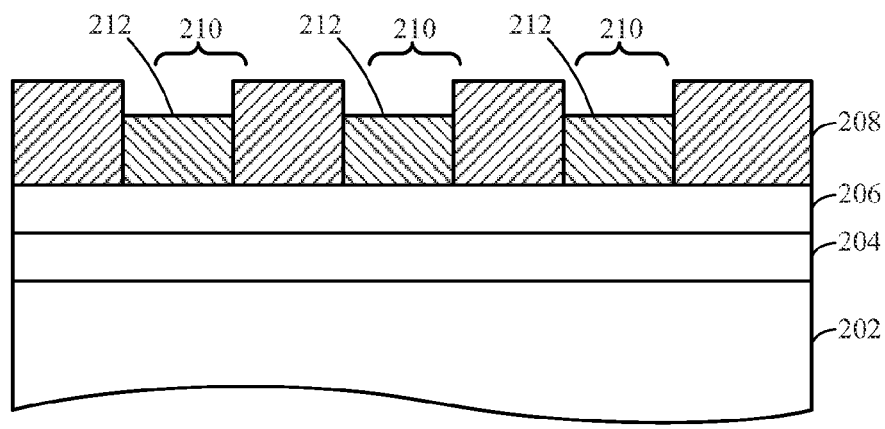
Figure 2C:
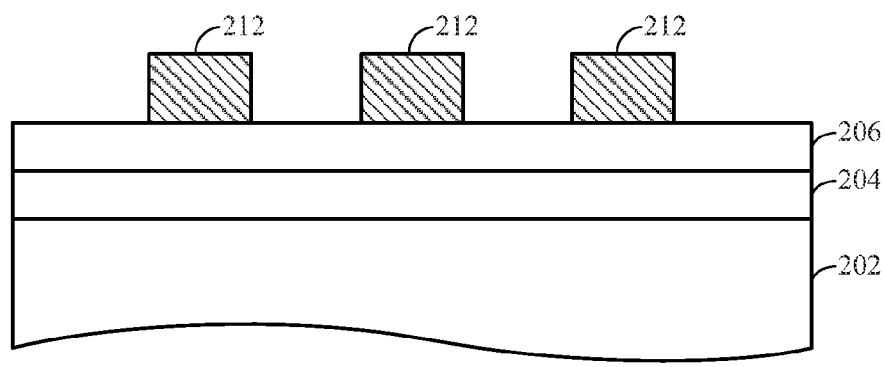
Figure 2D:
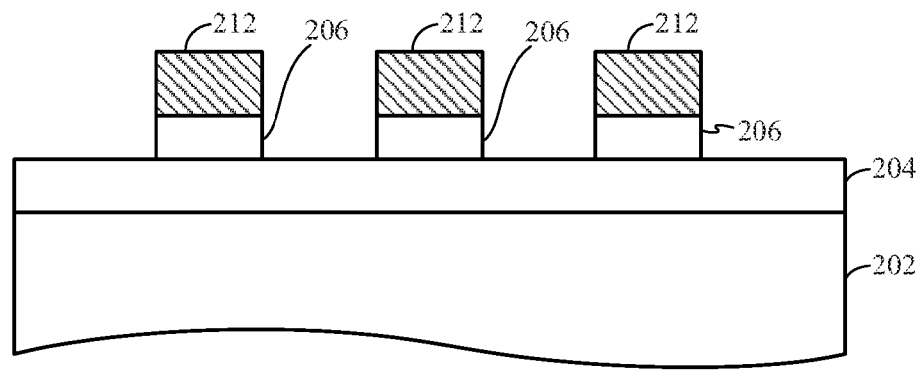
Figure 3A:
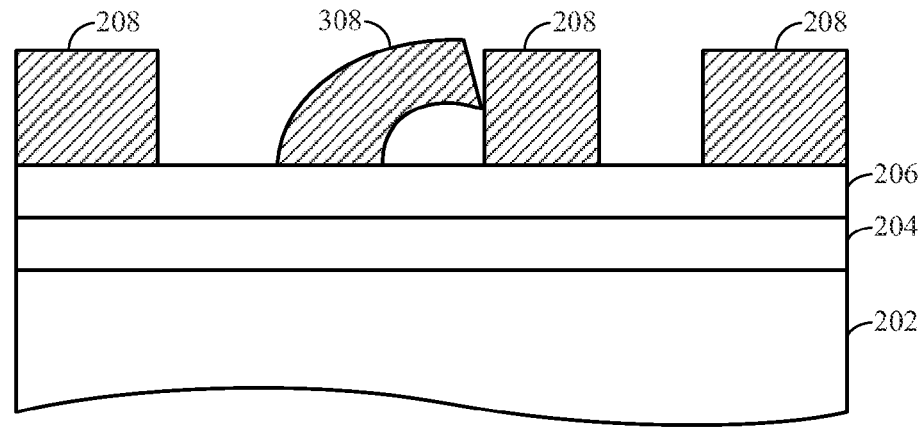
FIGS. 3A-B are cross-sectional views illustrating metallization failure in conventional integrated circuits.
Figure 3B:
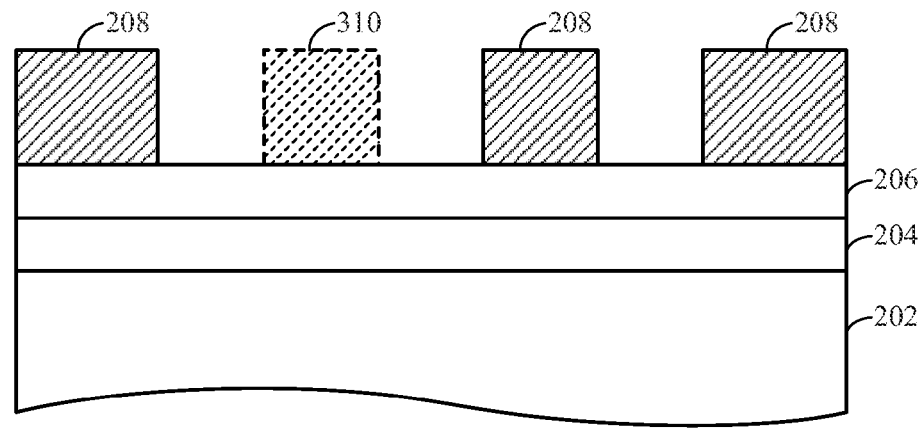
Figure 4:
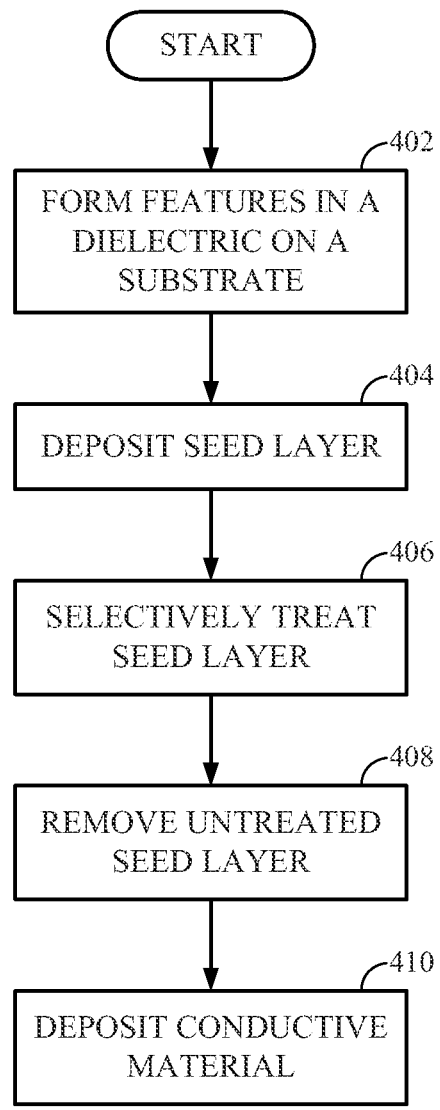
FIG. 4 is a flow chart illustrating an exemplary method for metallization in integrated circuits according to one embodiment.
Figure 5A:
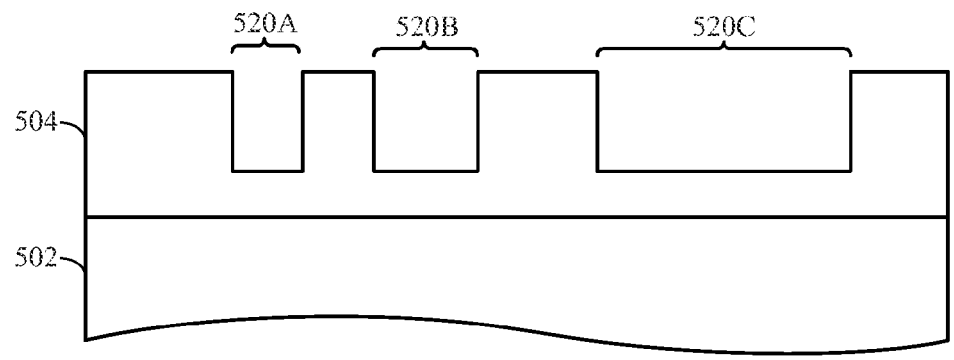
FIGS. 5A-E are cross-sectional views illustrating exemplary metallization in integrated circuits according to one embodiment.

FIG. 4 is a flow chart illustrating an exemplary method for metallization in integrated circuits according to one embodiment. At block 402 features are formed in a dielectric layer on a substrate. FIG. 5A is a cross-sectional view illustrating an exemplary metallization after patterning of openings according to one embodiment. A dielectric layer 504 on a substrate 502 includes features 520. The features 520 may be trenches as in features 520A, 520B and/or planes or pads as in feature 520C. The substrate 502 may be an type of suitable substrate material, for example, silicon, germanium, gallium arsenide, silicon oxide, magnesium oxide, aluminum oxide or an organic laminate type material.

Figure 5B:
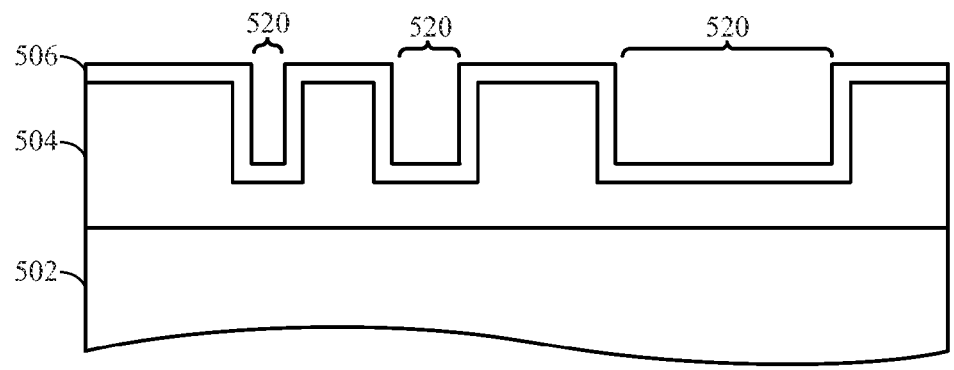

At block 404 a seed layer is deposited on the dielectric layer. FIG. 5B is a cross-sectional view illustrating an exemplary metallization after deposition of a seed layer according to one embodiment. A seed layer 506 is deposited on the dielectric layer 504 and in the features 520. The seed layer 506 may be, for example, a catalytic ink such as MicroCat, available from MacDermid, Inc. of Denver, Colo.

Figure 5C:
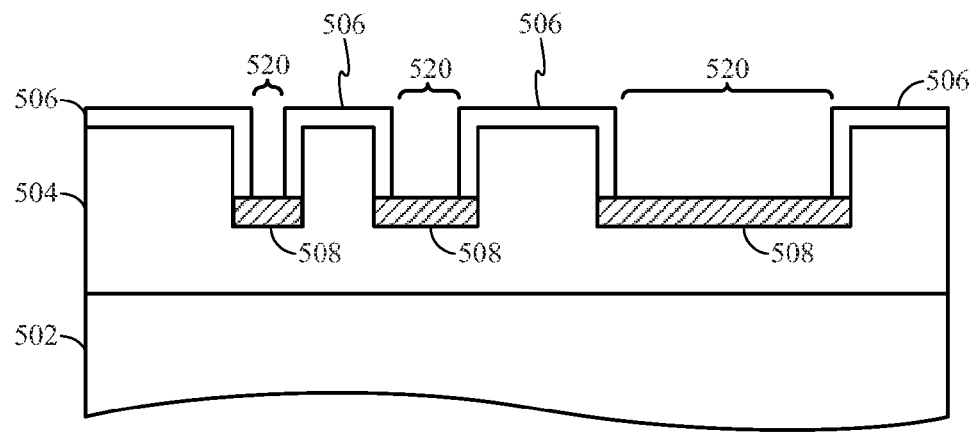

At block 406 the seed layer is selectively treated. FIG. 5C is a cross-sectional view illustrating an exemplary metallization after selective treatment of the seed layer according to one embodiment. The seed layer 506 is selectively treated in regions 508. Treatment of the regions 508 allows the remainder of the seed layer 506 to be removed separately from the regions 508. For example, the seed layer 506 may be cured by selectively rasterizing a laser in the regions 508 to alter the chemical properties of the regions 508. According to one embodiment, the seed layer 506 is a catalytic ink and after treatment the regions 508 do not dissolve in certain chemical etchants.

Figure 5D:
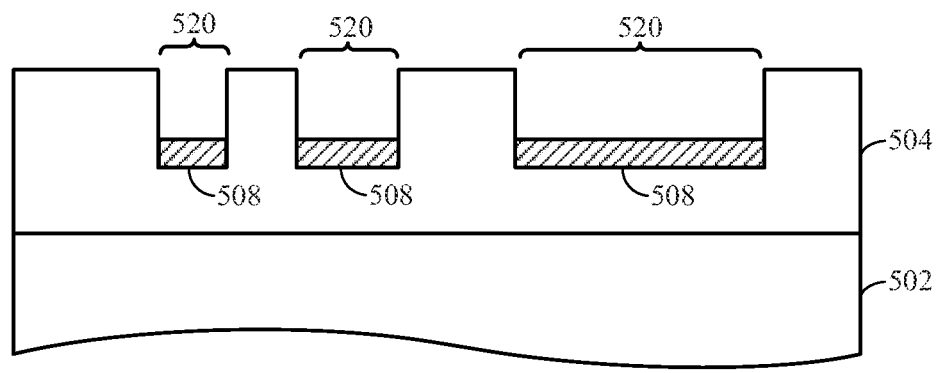

At block 408 the untreated regions of the seed layer are removed. FIG. 5D is a cross-sectional view illustrating an exemplary metallization after removal of the untreated seed layer according to one embodiment. The seed layer 506 is removed from the dielectric layer 504. According to one embodiment, the treated regions 508 of the seed layer 506 remaining are located on a bottom surface of the features 520 in the dielectric layer 504.

Figure 5E:
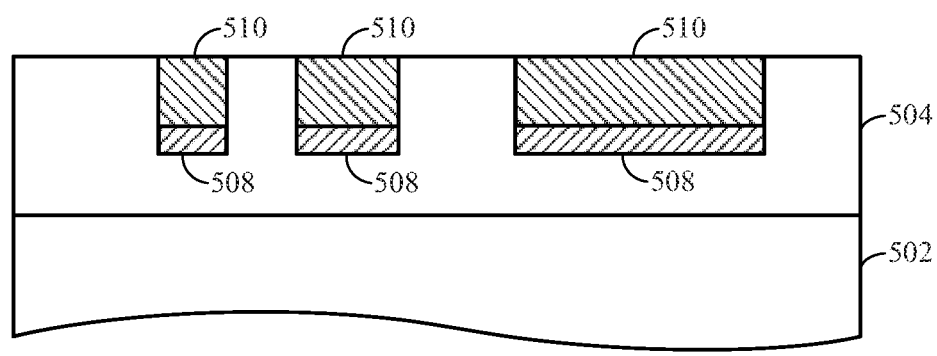

At block 410 conductive material is deposited to substantially fill the features. FIG. 5E is a cross-sectional view illustrating an exemplary metallization after deposition of a conductive material according to one embodiment. A conductive material 510 is deposited in the features 520 using the treated regions 508 as a seed layer. According to one embodiment, the conductive material 510 is electroless deposited. The conductive material 510 may be, for example, copper or nickel. Placement of the treated regions 508 on a bottom surface of the features 520 in the dielectric layer 504 allows the conductive material 510 to deposit into the features 520 without overplating over the dielectric layer 504. Because no overplating occurs on the dielectric layer 504, a surface of the conductive material 510 may be substantially parallel with a surface of the dielectric later 504 without planarization of the conductive material 510.

The metallization process with a selectively treated seed layer for deposition of conductive material allows metallization without a dry film patterning and lift-off process. Thus, the metallization process may scale to smaller sizes and higher density interconnects. Selectively plating features, such as trenches, pads, and planes, with electroless deposition reduces overplating of the conductive material, and thus, simplifies manufacturing processes. The simpler manufacturing processes reduce damage to the dielectric layer surrounding the features. For example, the conductive material filling the features is substantially planar with the dielectric layer without additional planarization processes.

Figure 6:
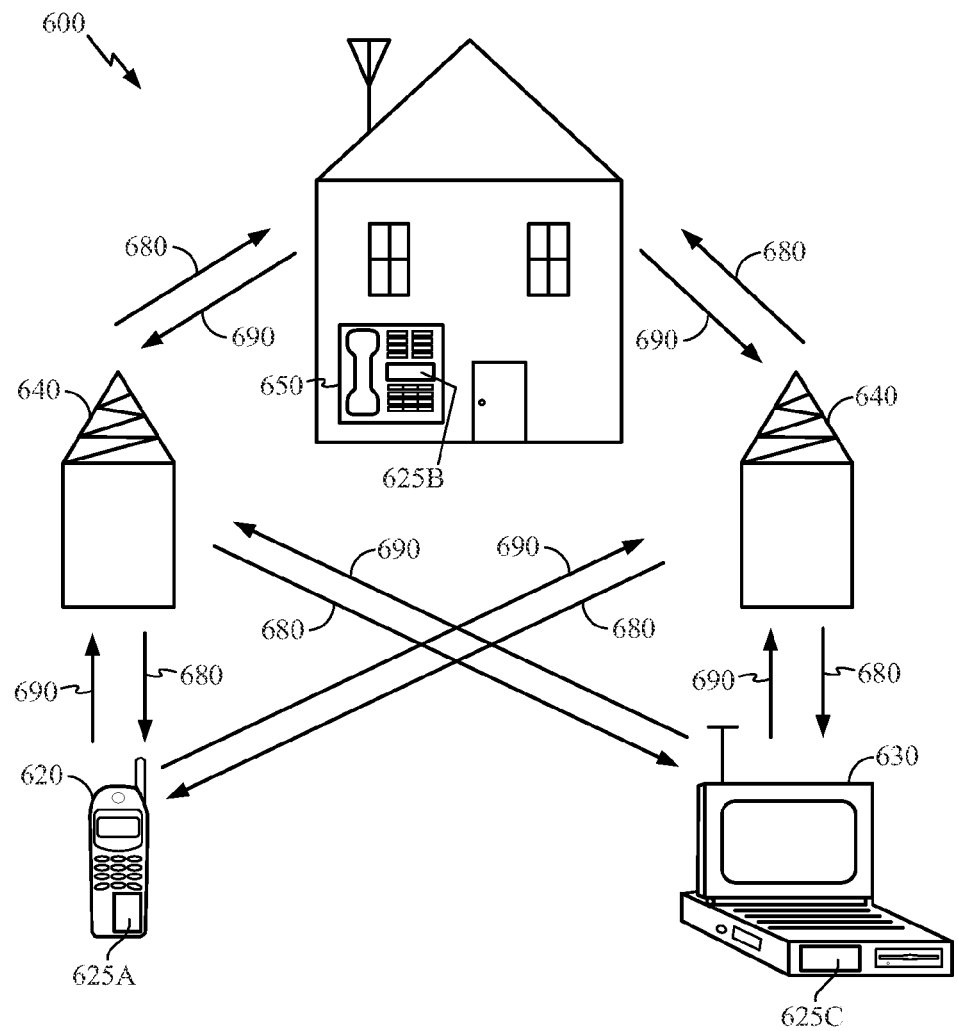
FIG. 6 is a block diagram showing an exemplary wireless communication system in which an embodiment of the disclosure may be advantageously employed.

FIG. 6 is a block diagram showing an exemplary wireless communication system 600 in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C and 625B, that include the disclosed metallization pattern. It will be recognized that any device containing an IC may also include the metallization pattern disclosed here, including the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 830 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 6 illustrates remote units according to the teachings of the disclosure, the disclosure is not limited to these exemplary illustrated units. Embodiments of the disclosure may be suitably employed in any device which includes metallization patterns.

Figure 7:
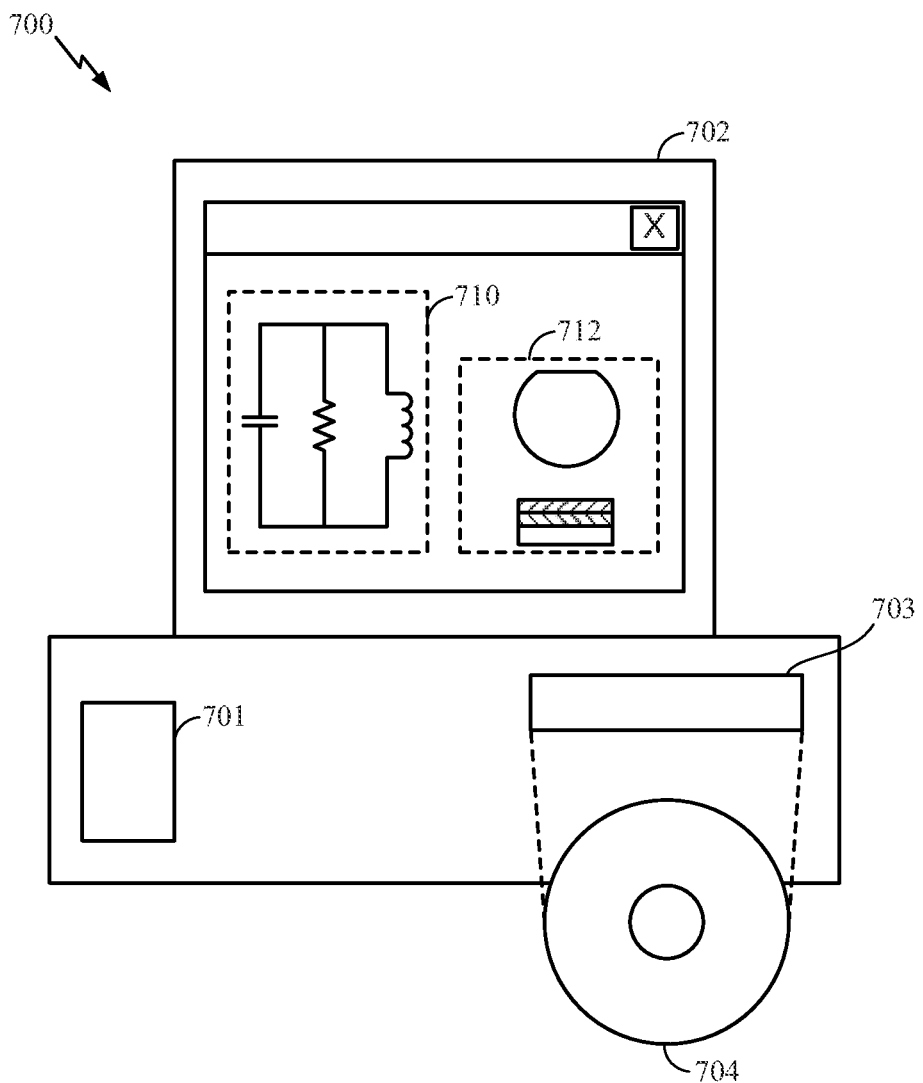
FIG. 7 is a block diagram illustrating a design workstation used for circuit, layout, and logic design of a semiconductor component according to one embodiment.

FIG. 7 is a block diagram illustrating a design workstation used for circuit, layout, and logic design of a semiconductor component, including a metallization pattern as disclosed above. A design workstation 700 includes a hard disk 701 containing operating system software, support files, and design software such as Cadence or OrCAD. The design workstation 700 also includes a display to facilitate design of a circuit 710 or a semiconductor component 712 such as a packaged integrated circuit having metallization patterns. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
forming a plurality of features comprising openings having sidewalls connected by an adjoining surface in a dielectric material;
depositing a polymer catalytic ink seed layer on the dielectric material and within the plurality of features;
selectively treating portions of the seed layer within the plurality of features by curing;
removing untreated seed layer portions with the cure polymer catalytic ink left on only portions of the sidewalls and the adjoining surface; and
plating the treated seed layer portions to selectively fill the plurality of features.

2. The method of claim 1, in which the plurality of features comprises at least one of a trench, a plane, and a pad.

3. The method of claim 1, in which selectively curing the seed layer comprises rasterizing a laser across selected portions of the seed layer.

4. The method of claim 1, in which the plating comprises electroless plating a conductive material into the plurality of features.

5. The method of claim 1, further comprising integrating the plurality of features into at least one of a mobile phone, a set top box, a music player, a video player, an entertainment unit, a navigation device, a computer, a hand-held personal communication systems (PCS) unit, a portable data unit, and a fixed location data unit.

6. An apparatus, comprising:
a dielectric layer on a surface of a substrate, the dielectric layer having a plurality of openings, each comprising sidewalls and an adjoining surface;
a seed layer only on a portion of the sidewalls and the adjoining surface of the plurality of openings, wherein the seed layer comprises a cured polymer catalytic ink; and
a conductive material substantially filling the plurality of openings.

7. The apparatus of claim 6, in which the conductive material comprises at least one of electrodeposited copper and electrodeposited nickel.

8. The apparatus of claim 6, in which the dielectric layer is on a substrate comprising at least one of silicon, germanium, gallium arsenide, magnesium oxide, aluminum dioxide, silicon dioxide and an organic laminate based material.

9. The apparatus of claim 6, in which the plurality of openings comprises at least one of a trench, a plane, and a pad.

10. The apparatus of claim 6, in which the substrate is integrated into at least one of a mobile phone, a set top box, a music player, a video player, an entertainment unit, a navigation device, a computer, a hand-held personal communication systems (PCS) unit, a portable data unit, and a fixed location data unit.

11. The apparatus of claim 6, in which the plurality of openings extend within but not through the dielectric layer.

\* \* \* \* \*